United States Patent [19]

Ebata et al.

[11] Patent Number: 4,770,121

[45] Date of Patent: Sep. 13, 1988

[54] SEMICONDUCTOR VAPOR PHASE GROWING APPARATUS

[75] Inventors: Hitoshi Ebata, Mishima; Yoshizo Komiyama, Gotenba, both of Japan

[73] Assignee: Toshiba Kikai Kabushiki Kaisha, Tokyo, Japan

[21] Appl. No.: 11,423

[22] Filed: Feb. 3, 1987

Related U.S. Application Data

[63] Continuation of Ser. No. 789,940, Oct. 23, 1985, abandoned, which is a continuation of Ser. No. 554,386, Nov. 22, 1983, abandoned.

[30] Foreign Application Priority Data

Nov. 27, 1982 [JP] Japan ................................ 57-207954

[51] Int. Cl.$^4$ ............................................. C23C 16/00
[52] U.S. Cl. ................................. 118/686; 118/687; 118/696; 118/697; 118/698; 118/715; 118/704; 118/729; 118/730; 118/503; 118/500; 901/2; 901/6; 414/730; 414/750; 414/136; 414/222; 414/225; 414/287
[58] Field of Search ............... 118/730, 729, 686, 687, 118/696, 697, 698, 704, 715, 729, 730, 500, 503; 414/273, 149, 161, 217, 730, 750, 225, 222, 136, 287; 901/36, 50

[56] References Cited

U.S. PATENT DOCUMENTS

| | | | |
|---|---|---|---|
| 3,306,471 | 2/1967 | Devol | 414/744 A |
| 3,749,383 | 7/1973 | Voigt et al. | 118/729 X |
| 3,765,763 | 10/1973 | Nygaard | 118/729 X |
| 3,918,593 | 11/1975 | Kaufeldt | 414/744 B |
| 3,943,343 | 3/1976 | Irie | 414/730 X |
| 3,989,003 | 11/1976 | Fagan et al. | 118/697 X |
| 4,207,836 | 6/1980 | Nonaka | 118/730 X |
| 4,293,249 | 10/1981 | Whelan | 414/217 |
| 4,386,578 | 6/1983 | Haslund | 118/729 X |
| 4,433,951 | 2/1984 | Koch | 414/217 |

Primary Examiner—Richard Bueker
Attorney, Agent, or Firm—Cushman, Darby & Cushman

[57] ABSTRACT

An apparatus for positioning a plurality of semiconductor substrates on a movable, support in a desired pattern, in a semiconductor vapor phase growing apparatus. A memory is provided for storing two dimensional data corresponding to the desired pattern. The desired pattern is predetermined by the sizes of the substrates and the space available on the flat support. A loading-/unloading device loads and unloads the substrates on the support at positions corresponding to the two-dimensional data read from the memory. A positioning device positions the support so that the substrates can be loaded and unloaded at the predetermined positions. A control device synchronizes the movement of the loading/unloading device and the positioning device in accordance with the selected position so that the substrates are loaded and unloaded on the flat support in the desired pattern.

29 Claims, 6 Drawing Sheets

| ADDRESS | ANGLE | RADIUS |
|---|---|---|
| 0 | 0 (ORIGIN) | |
| 1 | $\theta_1$ | |
| 2 | $\theta_2$ | |
| 3 | $\theta_3$ | L |
| 4 | $\theta_4$ | |
| n-2 | $\theta_{n-2}$ | |
| n-1 | $\theta_{n-1}$ | |
| n | $\theta_n$ | |

| ADDRESS | ANGLE | ABSOLUTE ANGLE | RADIUS |
|---------|-------|----------------|--------|
| 0 | 0 (ORIGIN) | 0 | |
| 1 | $\theta_1$ | 20 | $L_1$ |
| 2 | $\theta_2$ | 40 | |
| n | $\theta_n$ | 340 | |
| n+1 | $\theta_{n+1}$ | 0 (ORIGIN) | |
| n+2 | $\theta_{n+2}$ | 36 | $L_2$ |
| n+3 | $\theta_{n+3}$ | 72 | |
| m | $\theta_m$ | 200 | $L_3$ |
| m+1 | $\theta_{m+1}$ | 205 | $L_4$ |

SEMICONDUCTOR VAPOR PHASE GROWING APPARATUS

This is a continuation of application Ser. No. 789,940, filed Oct. 23, 1985, now abandoned, which, in turn, was a continuation of application Ser. No. 554,386, filed Nov. 22, 1983, now abandoned.

BACKGROUND OF THE INVENTION

This invention relates to semiconductor vapor phase growing apparatus in which substrates made of silicon, germanium or the like are mounted on a support which is rotatable or movable in one or more directions and semiconductor layers are formed epitaxially on the substrates, and more particularly to such apparatus including means for automatically loading and unloading substrates onto and from the support.

The work of arranging, in a predetermined pattern, a plurality of substrates on a support and removing the substrates from the support has been made manually. However, since conventional semiconductor vapor phase growing apparatus is operated at high temperatures and utilizes dangerous or poisonous reaction gases, it has been desired to provide an improved automatic device capable of loading and unloading the substrates without the danger of contacting the gases thereby improving the efficiency. For this reason, in a patent specification filed in Japan later than the instant application, there is disclosed automatic apparatus in which marks or irregularities for detecting the positions of the substrates are disposed about the support for positioning or indexing the support at each predetermined angle in accordance with the marks or irregularities so as to automatically load and unload the substrates. However, the size of the substrates arranged on the support is not always constant. For example, there are wafers having diameters of 4, 5 and 6 inches. Further, the vapor phase growth of respective substrates differs substantially due to the characteristic of the growing apparatus. Accordingly, it is not always necessary to arrange the substrates on the support at a definite spacing in a fixed pattern and, often, it is necessary to modify the arrangement according to the characteristic of the growing apparatus.

SUMMARY OF THE INVENTION

It is an object of this invention to provide improved semiconductor vapor phase growing apparatus capable of automatically and correctly loading and unloading substrates onto and from a support.

Another object of this invention is to provide novel semiconductor vapor phase growing apparatus including a memory device storing data regarding positions arranged on a movable support so that the support is successively indexed to definite angular positions at which substrates are mounted correctly.

According to this invention, there is provided semiconductor vapor phase growing apparatus wherein a plurality of semiconductor substrates are arranged in a desired predetermined pattern on a movable support and semiconductor layers are epitaxially grown on the semiconductor substrates, characterized in that there are provided a memory device for storing data regarding the positions of arrangement of the semiconductor substrates on the support, and positioning means for stopping the support at a predetermined position based on the data. A loading and unloading apparatus is provided for automatically loading and unloading the substrates onto and from the support.

DESCRIPTION OF THE PREFERRED EMBODIMENTS

Figure 1:
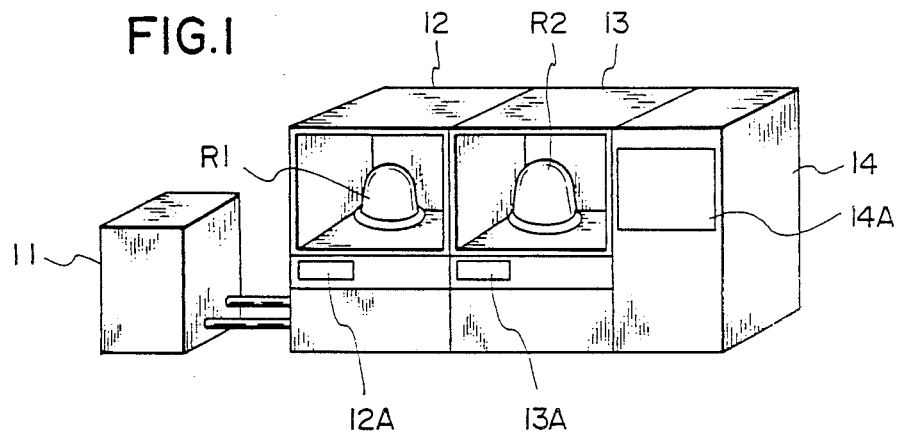
FIG. 1 is a perspective front view, partly broken away, showing a preferred embodiment of the semiconductor vapor phase growing apparatus according to this invention.

As shown in FIG. 1, the semiconductor vapor phase growing apparatus embodying the invention comprises, as its principal elements, a high frequency generator 11, at least one unit 12 and/or 13 respectively having reaction furnaces R1 and R2, and a controller 14 for controlling gas flow quantities to respective reaction furnaces, furnace temperatures and rotation of the support (often called a susceptor) as will be described later. The controller 14 is provided with an operating panel 14A including operating key input units, display units, etc., not shown. Reaction furnaces R1 and R2 are provided with operating panels, 12A and 13A respectively for opening and closing the furnaces.

Figure 2:
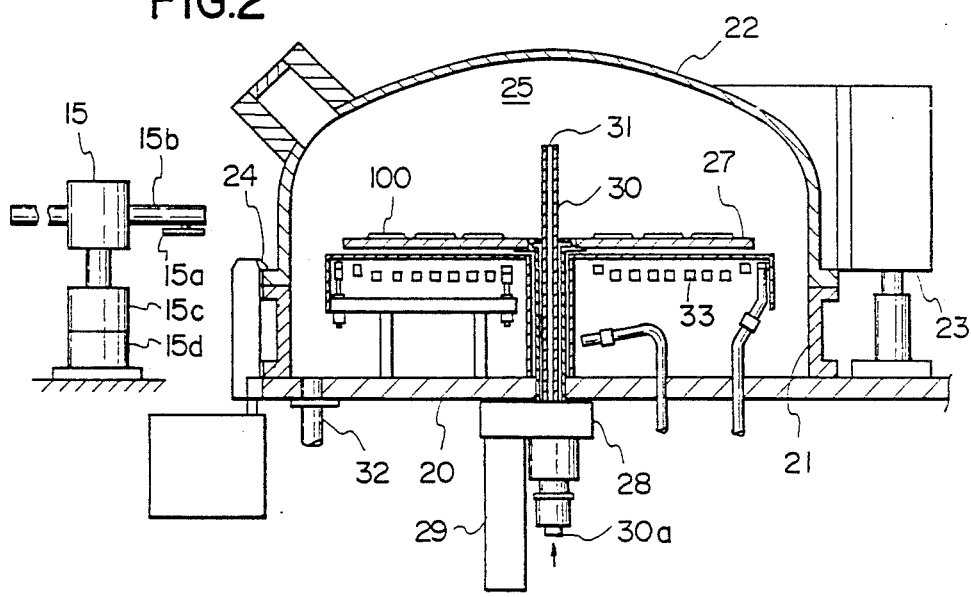
FIG. 2 is a partial sectional view showing the reaction furnace and the loading/unloading apparatus.

FIG. 2 shows the construction of the reaction furnace R1 or R2 and the loading/unloading apparatus. As shown, an annular ring 21 is mounted on a base 20, and a bell jar 22 is mounted on the ring 21 to be movable in the vertical direction by a piston cylinder assembly 23. The bell jar 22 is urged downward by clamping members 24 so as to hermetically seal joints between the bell jar 22 and the ring 21 and between the ring 21 and base 20 so as to define a furnace chamber 25 in the bell jar. At the center of the ring 21, there is provided a vertical hollow shaft 26 extending into the furnace chamber 25 from beneath the base 20. A circular disc shaped support 27 is secured to the upper end of the hollow shaft 26 to rotate therewith. The hollow shaft 26 is rotated by such driving motor 29 as a pulse motor or a servomotor through a reduction gearing 28, the rotational angle of the driving motor being controllable. A nozzle pipe 30 is provided to extend through the hollow shaft 26. Reaction gases, etc. are introduced into the lower end 30a of the nozzle pipe 30 to be ejected into the furnace chamber 25 through a nozzle opening 31 at the upper end. An exhaust pipe 32 is connected to the base 20 for exhausting used gas and not reacted gas.

A spiral high frequency induction heating coil 33 is provided beneath the support 27 and supplied with high frequency electric power from the high frequency generator 11 shown in FIG. 1 for inductively heating the support 27 and substrates 100 mounted thereon in a predetermined pattern as will be described later in more detail, so as to form epitaxially grown layers on the surfaces of the substrates by using the reaction gas ejected from the nozzle opening 31.

A plurality of sources of reaction gases and dopants are provided and the reaction gases and dopants are introduced into the reaction chamber through pipes and valves under the control of a computer as fully disclosed in a U.S. Pat. No. 4,430,959 dated Feb. 4, 1984 to Ebata et al. and assigned to the same assignee as the instant application. It should be understood that the same reaction of epitaxially growing semiconductors on the substrates is used.

The loading/unloading apparatus 15 is located outside of the ring 21 and is provided with an arm 15b having a hand 15a of the suction type, for example. The arm 15b is movable in the left and right directions as viewed in FIG. 2 so as to protrude above the support 27 through a gap formed between the ring 21 and the bell jar 22 when the same is raised by the piston cylinder assembly 23 for loading and unloading substrates 100 onto and from the support 27 with hand 15a. The loading/unloading apparatus 15 is equipped with an elevating member 15c and a rotating member 15d.

Figure 3:
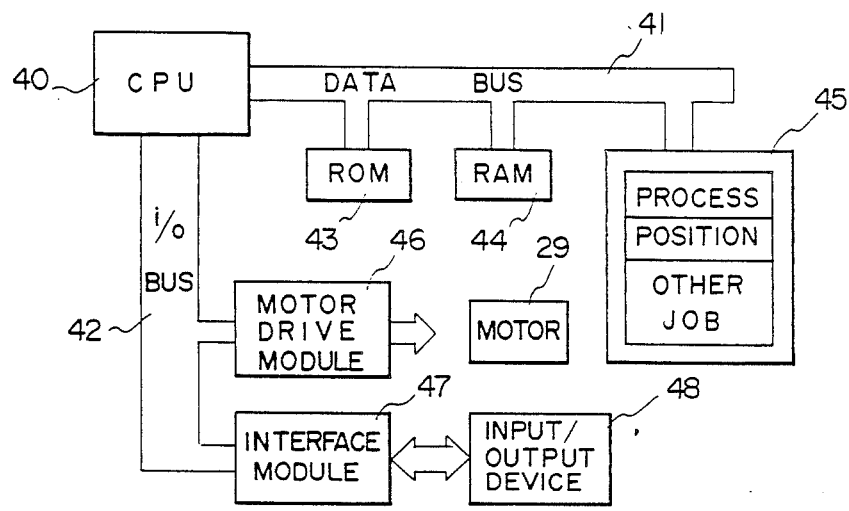
FIG. 3 is a block diagram showing the electric control system utilized in this invention.

The control system shown in FIG. 3 comprises a central processing unit (CPU) 40 of a master computer, which is connected to a data bus line 41 and an input-/output (I/O) bus line 42. To the data bus line 41 are connected a first memory device 43 (in the form of a ROM) adapted to store data regarding a series of process programs executed in respective reaction furnaces R1 and R2 and data regarding the positions of the substrates 100 arranged on the support 27, a temporary memory device 44 (in the form of a RAM) and a second memory device 45 adapted to store a process program for operating the control system, a position processing program regarding the arrangement of the substrates, a modified program for correcting the data of the program stored in the first memory device 43, for example, and the OTHER JOB processing program, for example a modified program. The temporary memory device 44 has a plurality of memory regions for storing data used in the operation of the control system, for example, input data from a keyboard, ON.OFF informations of various switches or a process program transferred from the first memory device 43, or the position data substrates 100 transferred can be corrected in the temporary memory device 44, if necessary.

An output module, that is a motor drive module 46 for controlling motor 29 shown in FIG. 2 is connected to the (I/O) bus line 42. To the (I/O) bus line 42 is also connected an interface module 47 for connecting an input/output device 48 regarding limit switches, pressure switches, push button switches, valves, lamps, luminous diodes, etc. to the CPU 40.

Figure 4:
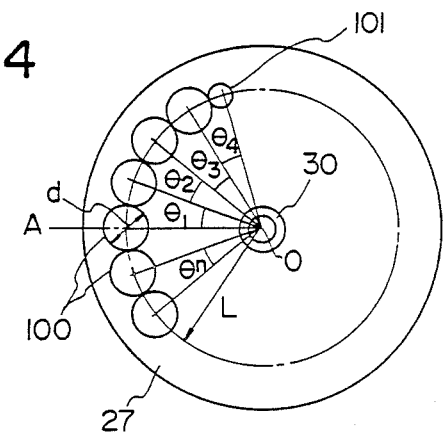
FIG. 4 is a plan view showing one example of arranging substrates and test pieces on a rotary support.

FIG. 4 shows one example of the arrangement of the substrates 100 on the support 27. As shown, the substrates 100 are disposed on a circle having a radius L from the center O of the support 27 not to overlap with each other. The positions of respective substrates 100 are given by polar coordinates with the center O as a reference point, the radius L and angles $\theta_1, \theta_2, \ldots \theta_n$, in which A represents the origin. Angles $\theta_1, \theta_2, \ldots \theta_n$ are determined by the diameter d of the substrate 100, and the value of the radius L. In certain cases, one or more test pieces 101 having smaller dimension (diameter) than the substrates are interposed. Test pieces are used for the purpose of checking the quality of the epitaxially grown semiconductors formed under the same conditions.

In this example of arrangement, angles $\theta_1, \theta_2, \ldots \theta_n$ are stored in the data memory regions of the first memory device 43 shown in FIG. 3. More particularly, as shown in FIG. 5, digitalized values of angles, 0 (origin), $\theta_1, \theta_2, \ldots \theta_n$ and the radius L corresponding to addresses 0–n are stored in the memory regions.

Figures 5, 6:
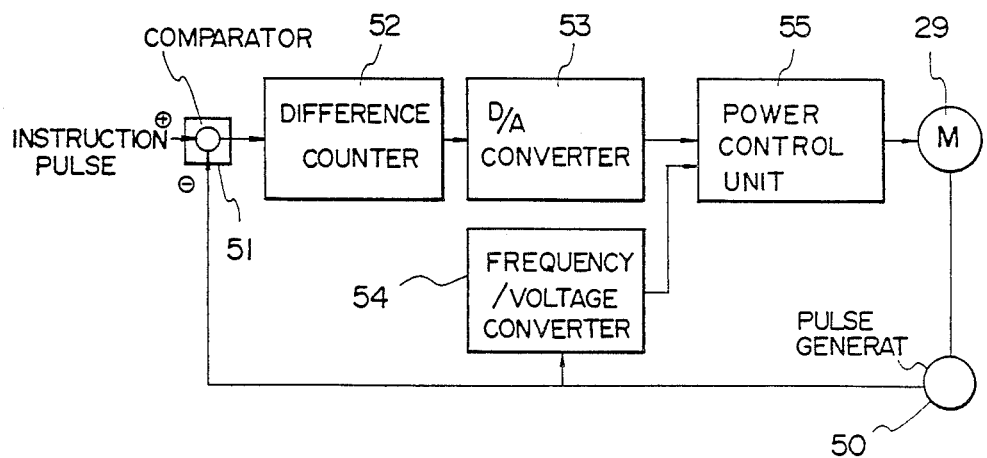
FIG. 5 shows one example of the data stored in a memory device regarding the positions of the substrates and test pieces arranged on the support in a predetermined pattern.
FIG. 6 is a block diagram showing one example of a control circuit for determining the rotational angle of the support.

FIG. 6 shows one example of the control circuit incorporated in Motor Drive Module 46. The control circuit utilizes a DC motor as the driving motor 29. The control circuit comprises a pulse generator 50, driven by motor 29, a comparator 51, a difference counter 52, a D/A converter 53, a frequency/voltage converter 54 and a power control unit 55 which are connected as shown. When instruction pulses corresponding to angles $\theta_1, \theta_2, \ldots \theta_n$ are sequentially applied to the comparator 51, the motor 29 positions or indexes the support 27 to the positions of $\theta_1, \theta_2, \ldots \theta_n$, respectively.

Figure 7:
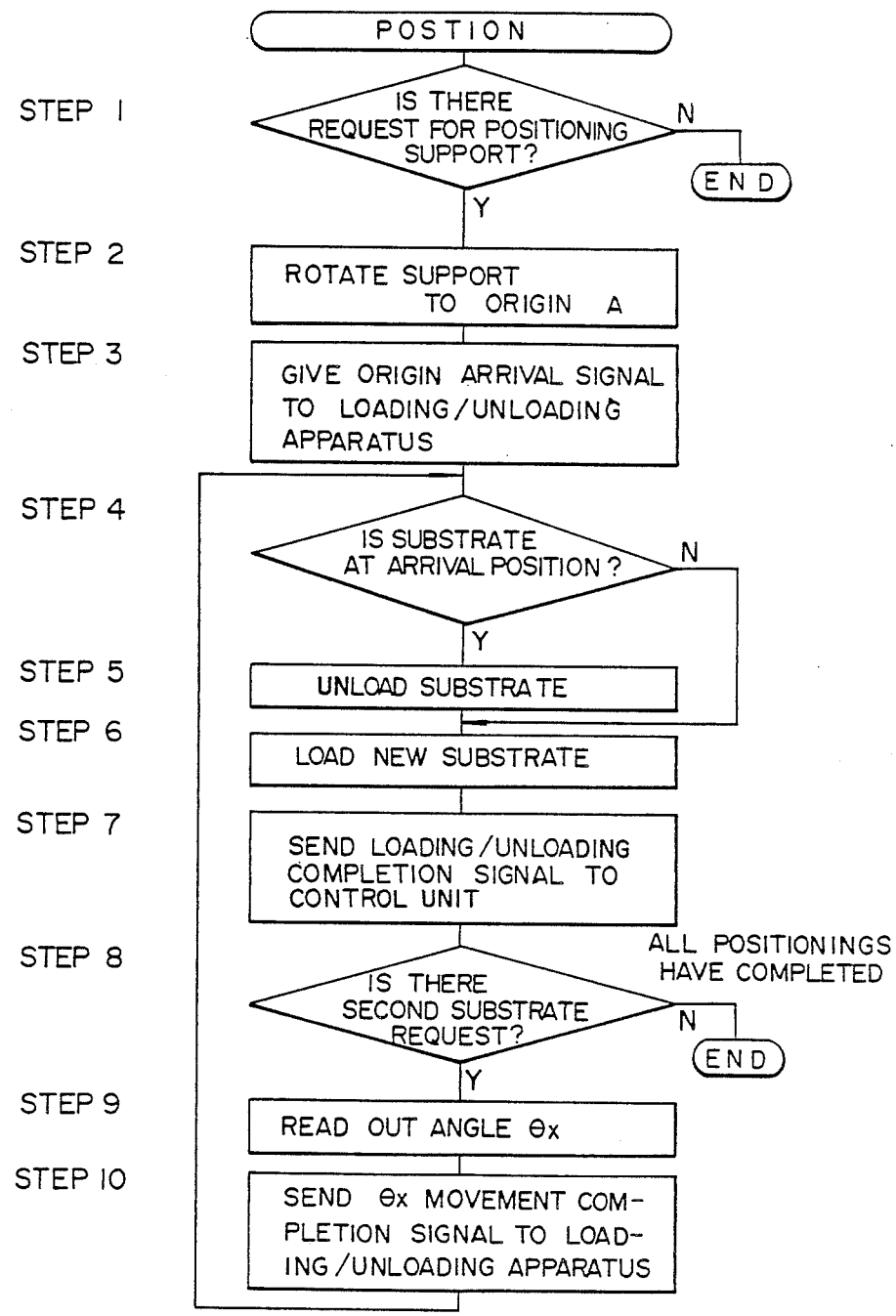
FIG. 7 is a flow chart showing principal processings of a position processing program regarding the arrangement of the substrates and test pieces on the support.

FIG. 7 is a flow chart showing the contents of the principal processings of the position processing program regarding the arrangement of the substrates on the support. At step 1 a judgment is made whether there is a request for positioning the support 27 for loading and unloading the substrate. When the result of judgment at step 1 is YES, at step 2, the support 27 is rotated to a position at which its origin A comes to a position corresponding to hand 15a of the loading/unloading apparatus.

The positioning of origin A is made by an element to be detected (not shown) provided for the support and a detecting element mounted on base 20 or the like to cooperate with the element to be detected. The detecting element may be mounted on arm 15b or hand 15a of the loading/unloading apparatus 15 so as to project the arm 15b above the support 27 prior to the positioning of the origin A so as to bring the detecting element to a position confronting the element to be detected.

Upon completion of the positioning of the origin A, at step 3, an origin arrival signal is given to the loading-/unloading apparatus 15. Then at step 4, a judgment is made as to whether a substrate 100 is at an arrival position (at first the position of the origin A) on the support corresponding to hand 15a. This judgment can be made with hand 15a or another detecting means. Where a substrate is present at the arrival position, at step 6, the substrate is unloaded with the loading/unloading apparatus 15, and at step 6, a new substrate is mounted on the support 27 at the origin A. When the result of judgment at step 4 is NO, the program is jumped to step 6 for mounting a new substrate. When a new substrate is mounted with or without unloading a given substrate, a loading/unloading completion signal is sent to the control unit 14 at step 7. After sending out a first loading-/unloading completion signal, at step 8, a judgment is made as to whether there is a next (second) substrate request for issuing a first substrate request following the origin A so that at step 9, angle $\theta_1$, the value of the first address shown in FIG. 5 and stored in the first memory device 43 shown in FIG. 3, is read out to rotate the motor 29 so as to rotate by an angle $\theta_1$ the support 27 by the control circuit shown in FIG. 6. When the support 27 is rotated by $\theta_1$, at step 10, a $\theta_1$ movement completion signal is sent to the loading/unloading apparatus 15.

When $\theta_1$ movement completion signal is given to the loading/unloading apparatus 15, as shown by step 4, a judgment is made as to whether a substrate 100 is present at the $\theta_1$ position or not. Thereafter, an operation similar to that described above regarding the origin A is repeated for loading and unloading a substrate 100 at the $\theta_1$ position. Thereafter the second and succeeding substrates are processed in the same manner until the last or nth substrate. Upon completion of the loading and unloading of the nth substrate, the request for a subsequent substrate at step 8 is not necessary, thereby completing a series of position processing program.

The spacings between the positions for mounting the substrates 100 can be made to be equal or not by suitably predetermining the values of angles 0, $\theta_1$, $\theta_2$, . . . $\theta_n$ prestored in respective addresses 0–n shown in FIG. 5. Where the diameter of the substrate varies, the stored values of angles $\theta_1$–$\theta_n$ are modified by using a suitable positioning program.

Figure 8:
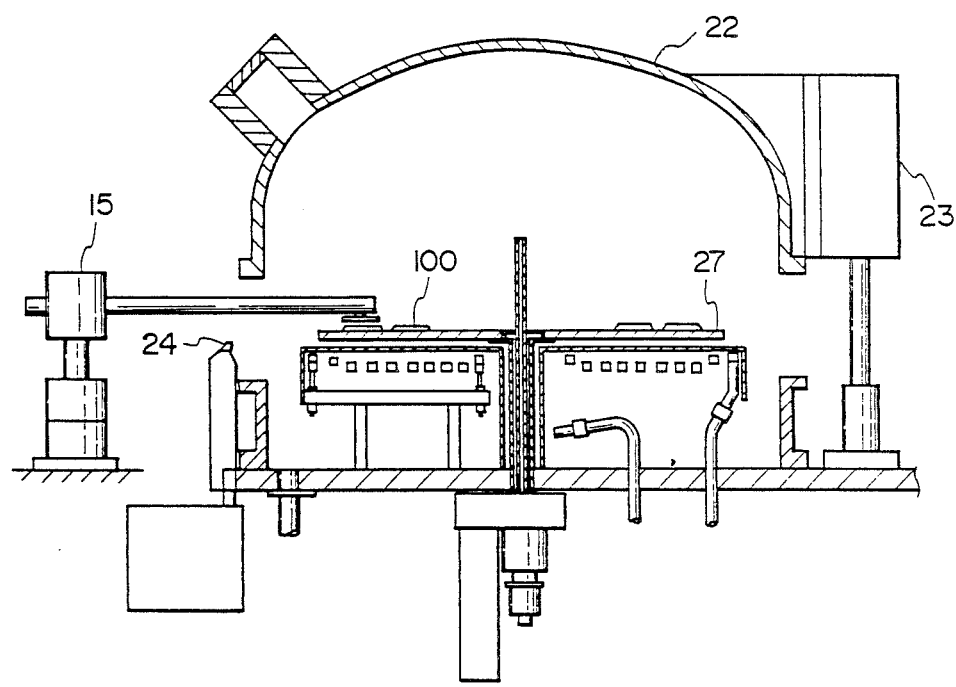
FIG. 8 is a sectional view, similar to FIG. 2 except that the bell jar is raised.

The operation of the apparatus is as follows. First, the operating panel 12A or 13A shown in FIG. 1 is manipulated to raise bell jar 22 (see FIG. 2) of the reaction furnace R1 or R2 to the position shown in FIG. 8 with the piston cylinder assembly 23.

Then by executing the position processing program shown in FIG. 7, the support 27 is successively positioned to one of predesignated positions of first to nth from the position of origin A. Then, the arm 15b of the loading/unloading apparatus 15 is projected to a circle of radius L at which a substrate is mounted on the support 27, thus automatically loading and unloading substrates 100 and test piece 101 at respective positions. At the time of starting the operation, since there is no substrate to be unloaded from the support, steps 4 and 5 of the program 7 are omitted beforehand, whereas at the last operation, step 6 is eliminated. This can readily be made by temporarily changing the position processing program.

When the loading/unloading operation of the substrates and test piece onto and from the support is completed, the piston cylinder assembly 23 is actuated to lower the bell jar 22 to hermetically urge it against ring 21. Then clamping members 24 are actuated to hermetically clamp together bell jar 22, ring 21 and base 20.

Then, according to the processing program stored in the first memory region 43 shown in FIG. 3, the vapor phase epitaxial growth is effected by controlling the type and quantity of the gas ejected from nozzle 30, the temperatures of support 27, substrates 100 and test piece 101 heated by the high frequency induction heating coil 33, and the rotation of the support driven by motor 29.

Upon completion of one vapor phase growing cycle, the bell jar 22 is raised again with the piston cylinder assembly 23 to take out substrates and test pieces on which semiconductor layers have been grown and new substrates and test piece are loaded according to the position processing program.

Figure 9:
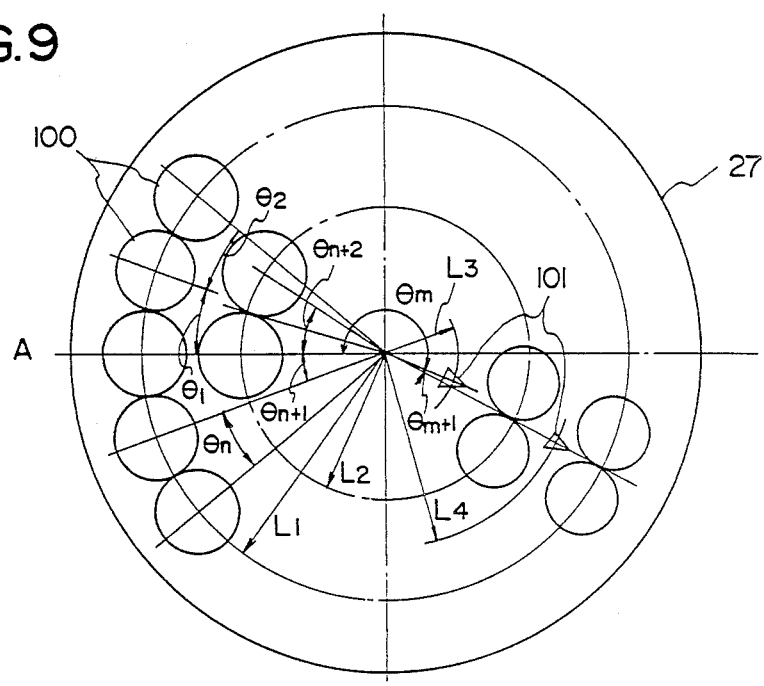
FIG. 9 is a plan view showing another example of the arrangement of the substrates and test pieces on the support.

FIG. 9 shows another arrangement of the substrates 100 and test pieces 101 on the support 27. In this case, the substrates 100 are arranged on two circles having radii $L_1$ and $L_2$ respectively, while test pieces 101 are arranged on two circles having radii $L_3$ and $L_4$ respectively. The arrangement on the circle having a radius $L_1$ corresponds to that shown in FIG. 4, while the arrangement on the circle having a radius $L_2$ has different angles $\theta_{n+2}$ . . . between adjacent substrates from above mentioned angles $\theta_1$–$\theta_n$ even when substrates on both circles have the same diameter.

Figures 10, 11:
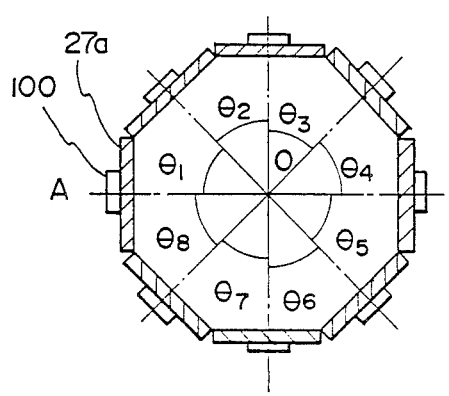
FIG. 10 shows data stored in the memory device corresponding to the arrangement shown in FIG. 9.
FIG. 11 is a cross-sectional view of a barrel type support.

FIG. 10 is a chart showing the position data of the substrates 100 and test pieces 101 shown in FIG. 9. In this example, not only the angles between substrates and between test pieces but also the absolute angles measured from the origin A are stored. The absolute angles allow an automatic determination of the order of arrangement by comparing the values of the absolute angles with the position processing program. For example, after determining the 10th and the first addresses as well as loading and unloading operations of the substrates at the origin A, prior to advance to the second address having an absolute angle of 40°, the support is positioned to (n+2)th address having an absolute angle of 36° and the substrate is loaded and unloaded at this position. Then the support is advanced to the position corresponding to the second address. Thus, this memory chart is useful to rotate the support by only one revolution even when the substrates and test pieces are arranged on circles having different radii $L_1$–$L_4$.

In this case, the difference between the absolute angles of the previously positioned address and of the address to be positioned next is inputted as an instruction pulse shown in FIG. 6 whereby the loading/unloading apparatus 15 is operated to load and unload on a circle having a radius correspnding to the address to be positioned next, for example radius $L_2$ in the case of (n+2)th address.

FIG. 11 shows a vertical barrel type rotary support 27a utilized in this invention. As shown, the support 27a has a polygonal cross-sectional configuration adapted to mount substrates or test pieces on respective side surfaces. In this case too, the support 27a is successively positioned in accordance with the angles of arrangement $\theta_1$, $\theta_2$, . . . of the substrates so as to load and unload the substrates. The loading/unloading apparatus utilized in this case is constructed to be movable also in the axial direction of the support so as to mount the substrate also in the axial direction.

Although not shown, the support 27a is contained in a cylindrical casing made of transparent material, for example quartz, and the substrates mounted on the support are heated by incandescent lamps disposed about the cylindrical casing.

Although in the foregoing embodiments, a rotary support was illustrated it should be understood that the invention is also applicable to such support in which the substrates and/or test pieces are arranged on one or more parallel straight rows. In such case, instead of positioning the support according to rotational angles, the positioning is made in the x or y axis direction of rectangular coordinates.

Although in the foregoing embodiments, the origin A of the support is determined so as to store angles $\theta_1$, $\theta_2$, . . . measured from the origin as instruction values for respective arrangements (circles or rows), where angles $\theta_1$, $\theta_2$, . . . are constant, only one of them is stored and the order of angles is designated. Alternatively, where it is possible to read the angular position of the support or the absolute position along x or y axis, instructions can be issued at such absolute position. Thus, it will be clear that many changes and modifications can be made without departing from the spirit and scope of the invention.

As above described, according to this invention, data regarding the positions of the substrates mounted on a support are prestored in the memory device of the control device so as to successively position the support to specific positions for loading and unloading substrates with loading/unloading apparatus. Accordingly, a detector such as a sensor may be only one for detecting the origin. This simplifies the construction and control, especially of the loading/unloading apparatus which is especially advantageous for the support subjected to high temperatures. Moreover, it is possible not only to accurately position the support but also change the positions of mounting. Even when a test piece having a different size is interposed between the substrates the test piece can be processed in the same manner as the substrates. Furthermore, where the diameter is different for respective substrates, data corresponding to different diameters are prestored. Then accurate control can be made for substrates having different diameters.

What is claimed is:

1. Apparatus for positioning a plurality of substrates on a movable support in a desired pattern, in a semiconductor vapor phase growing apparatus, comprising:
    (a) a computer control system including:
       (1) a central processing unit;
       (2) first memory means with data areas having a plurality of positions corresponding to specific positions on a surface of said support, said data areas of said first memory means being defined by addresses storing corresponding data regarding said specific positions;
       (3) means for correcting said specific position data stored in said first memory means in accordance with sizes of the substrates to generate corrected loading and unloading position data;
       (4) temporary memory means storing said corrected loading and corrected unloading position data from said correcting means;
       (5) a motor drive module connected to said central processing unit for moving said support; and
       (6) second memory means storing (a) a position program for causing said central processing unit to supply said corrected loading and unloading position data in said temporary memory means to said motor drive module, and (b) a modified program for causing said means for correcting to correct said specific position data in accordance with sizes of said substrates to generate said corrected loading and unloading position data;
    (b) loading/unloading means for loading and unloading said substrates onto and from said support at positions corresponding to said corrected loading and unloading position data, said loading/unloading means being movable in a vertical direction and extendable in a horizontal direction; and
    (c) positioning means controlled by said motor drive module for moving said support so that said substrates can be loaded and unloaded thereon at positions corresponding to said corrected loading and unloading position data;
    said computer control system synchronizing the movements of said loading/unloading means and said positioning means in accordance with said corrected loading and unloading position data so that said substrates are loaded and unloaded on said support in said desired pattern by movement of said support and vertical and horizontal movements of said loading/unloading means.

2. Apparatus according to claim 1 wherein said loading/unloading means includes detecting means for detecting a substrate.

3. Apparatus according to claim 1 wherein said temporary memory means stores test piece position data.

4. Apparatus according to claim 3 wherein said loading/unloading means loads and unloads test pieces onto and from said support at positions corresponding to said test piece position data.

5. Apparatus according to claim 4 wherein said loading/unloading means includes means for loading/unloading at least one test piece adjacent at least one substrate.

6. Apparatus according to claim 1 wherein said temporary memory means stores said corrected loading and unloading position data in the form of polar coordinates, and wherein said positioning means moves said support in accordance with one of said polar coordinates, and wherein said loading/unloading means positions said semiconductor substrates in accordance with a second one of said polar coordinates.

7. Apparatus according to claim 1 wherein said positioning means includes means for stopping said support at predetermined angular positions based on said corrected loading and unloading position data.

8. Apparatus according to claim 7 wherein said temporary memory means includes means for storing a plurality of angular positions and radial direction position information as said corrected loading and unloading position data, and wherein said loading/unloading means includes means for positioning said loading/unloading means in accordance with said radial direction position information from said temporary memory means.

9. Apparatus according to claim 1 wherein said temporary memory means includes means for storing loading position data and unloading position data for a plurality of substrates having different sizes.

10. Apparatus according to claim 1 further including said support, said support having a rotary support member with a polygonal cross-section, said rotary member being movable along its longitudinal axis.

11. Apparatus according to claim 10 wherein said temporary memory means includes means for storing a plurality of angular positions and a plurality of axial positions with respect to said polygonal rotary support member, and wherein said loading/unloading means is positioned according to the stored axial positions.

12. Apparatus according to claim 1 wherein said temporary memory means stores said loading position data and said unloading position data in the form of rectangular coordinantes, and wherein said positioning means moves said support in accordance with a first one of said rectangular coordinantes, and wherein said loading/unloading means loads and unloads said semiconductor substrates in accordance with a second one of said rectangular coordinantes.

13. The apparatus according to claim 1 wherein said support comprises a rotary member having a polygonal cross-section.

14. The apparatus according to claim 13 wherein said polygonal rotary support is shiftable along an axis thereof.

15. The apparatus according to claim 1 wherein said desired pattern is defined in terms of polar coordinates, said support is positioned along one direction of said polar coordinates by said positioning means, and said loading/unloading means is adapted to position said semiconductor substrates along the other direction of said polar coordinates.

16. Apparatus according to claim 1 including said substrates of substantially different sizes.

17. Apparatus according to claim 16 wherein said stored pattern is predetermined for a given set of numbers and sizes of said substrates.

18. Apparatus according to claim 1 wherein said desired pattern is defined in terms of X, Y coordinates.

19. The apparatus according to claim 1 wherein said support comprises a rotary disc.

20. Apparatus according to claim 19 wherein said desired pattern comprises a plurality of circles of substrates, said circles having different radii and being arranged coaxially with said rotary disc, said circles each containing different numbers of substrates.

21. Apparatus according to claim 20 wherein said computer control system synchronizes said rotary disc and said loading/unloading means so that all of said substrates are placed on said rotary disc in one revolution of said rotary disc.

22. Apparatus according to claim 20 wherein said substrates are substantially different sizes.

23. Apparatus according to claim 20 wherein said substrates of each of said circles are not radially colinear with the substrates of the other said circles.

24. The apparatus according to claim 20 wherein said temporary memory means has a plurality of memory regions respectively storing rotational angles of said support at which said substrates are to be mounted, absolute values of said rotational angles and radii of said circles.

25. The apparatus according to claim 20 wherein a semiconductor test piece having the same or different configuration as said substrates is interposed between adjacent substrates.

26. The apparatus according to claim 19 wherein said positioning means includes means for stopping said rotary disc at predetermined angular positions based on said desired pattern.

27. The apparatus according to claim 26 wherein said temporary memory means includes a plurality of memory regions for storing data regarding said angular positions of said support.

28. The apparatus according to claim 27 wherein said memory regions store other data regarding radial positions of said semiconductor substrates on said rotary disc and said loading and unloading means is positioned according to said other data.

29. The apparatus according to claim 28 wherein said temporary memory means stores said other data for a plurality of positions corresponding to substrates having different sizes.

* * * * *